United States Patent
Yamamoto et al.

(10) Patent No.: US 9,939,495 B2
(45) Date of Patent: Apr. 10, 2018

(54) VOLTAGE DETECTING CIRCUIT AND VOLTAGE DETECTING METHOD

(71) Applicant: YAZAKI CORPORATION, Tokyo (JP)

(72) Inventors: Kyohei Yamamoto, Shizuoka (JP); Yoshihiro Kawamura, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 15/291,888

(22) Filed: Oct. 12, 2016

(65) Prior Publication Data

US 2017/0108556 A1    Apr. 20, 2017

(30) Foreign Application Priority Data

Oct. 19, 2015   (JP) .................................. 2015-205533

(51) Int. Cl.
*H02J 7/00* (2006.01)
*G01R 31/36* (2006.01)

(52) U.S. Cl.
CPC ....... *G01R 31/3696* (2013.01); *G01R 31/362* (2013.01)

(58) Field of Classification Search
CPC .......................... G01R 31/3696; G01R 31/362
USPC ................................. 324/430, 437; 320/137
See application file for complete search history.

(56) References Cited

U.S. PATENT DOCUMENTS

| 2011/0084705 | A1 | 4/2011 | Kawamura |
| 2012/0262183 | A1* | 10/2012 | Kawamura .......... G01R 31/025 324/509 |
| 2012/0293133 | A1 | 11/2012 | Kim |

FOREIGN PATENT DOCUMENTS

| JP | 2012-220470 A | 11/2012 |
| JP | 5613408 B2 | 10/2014 |

OTHER PUBLICATIONS

Japanese Office Action for the related Japanese Patent Application No. 2015-205533 dated Sep. 19, 2017.

* cited by examiner

*Primary Examiner* — Farhana Hoque
(74) *Attorney, Agent, or Firm* — Kenealy Vaidya LLP

(57) ABSTRACT

A voltage detecting circuit includes a ground potential unit, a DC power supply which is insulated from the ground potential unit, a capacitor to which voltage from the DC power supply is applied, a control unit which controls charging and discharging of the capacitor, a charging circuit that includes the DC power supply, the capacitor and a charging path through which the capacitor is charged, and a discharging circuit that includes the capacitor and a discharging path through which the capacitor is discharged. The control unit includes a calculation unit which calculates a voltage value of the DC power supply, based on an actual capacitance value C of the capacitor which is obtained by both-end voltage of the capacitor corresponding to a first time and the both-end voltage of the capacitor corresponding to a second time.

4 Claims, 15 Drawing Sheets

FIG. 12
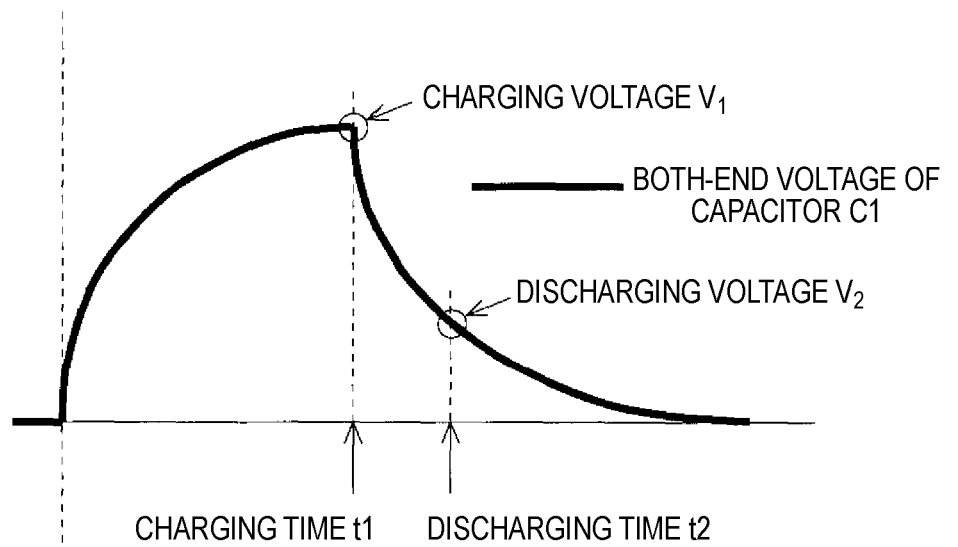
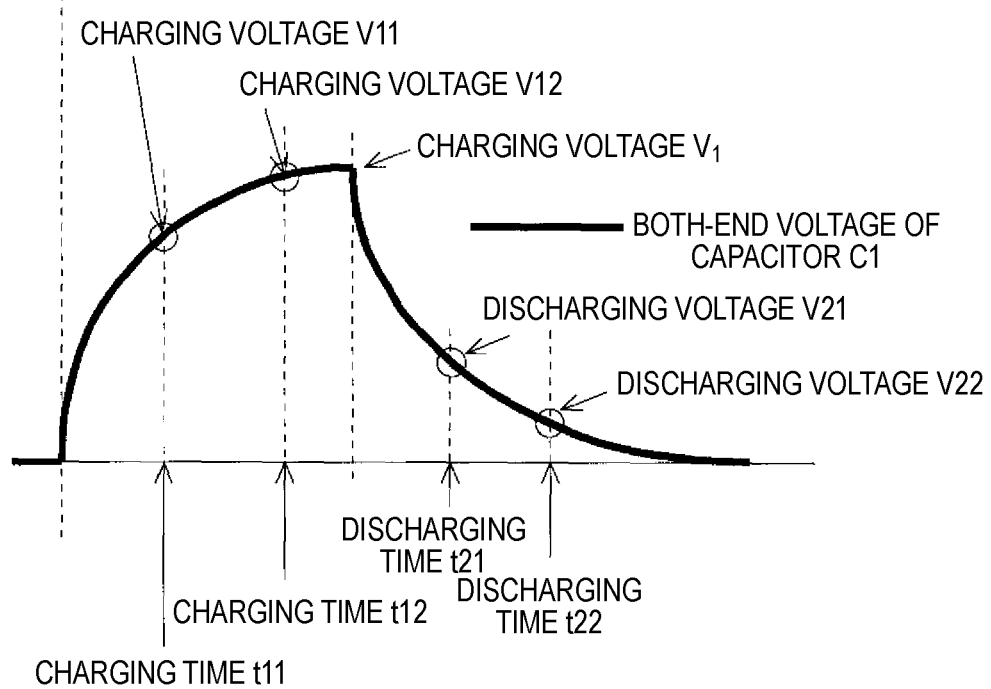

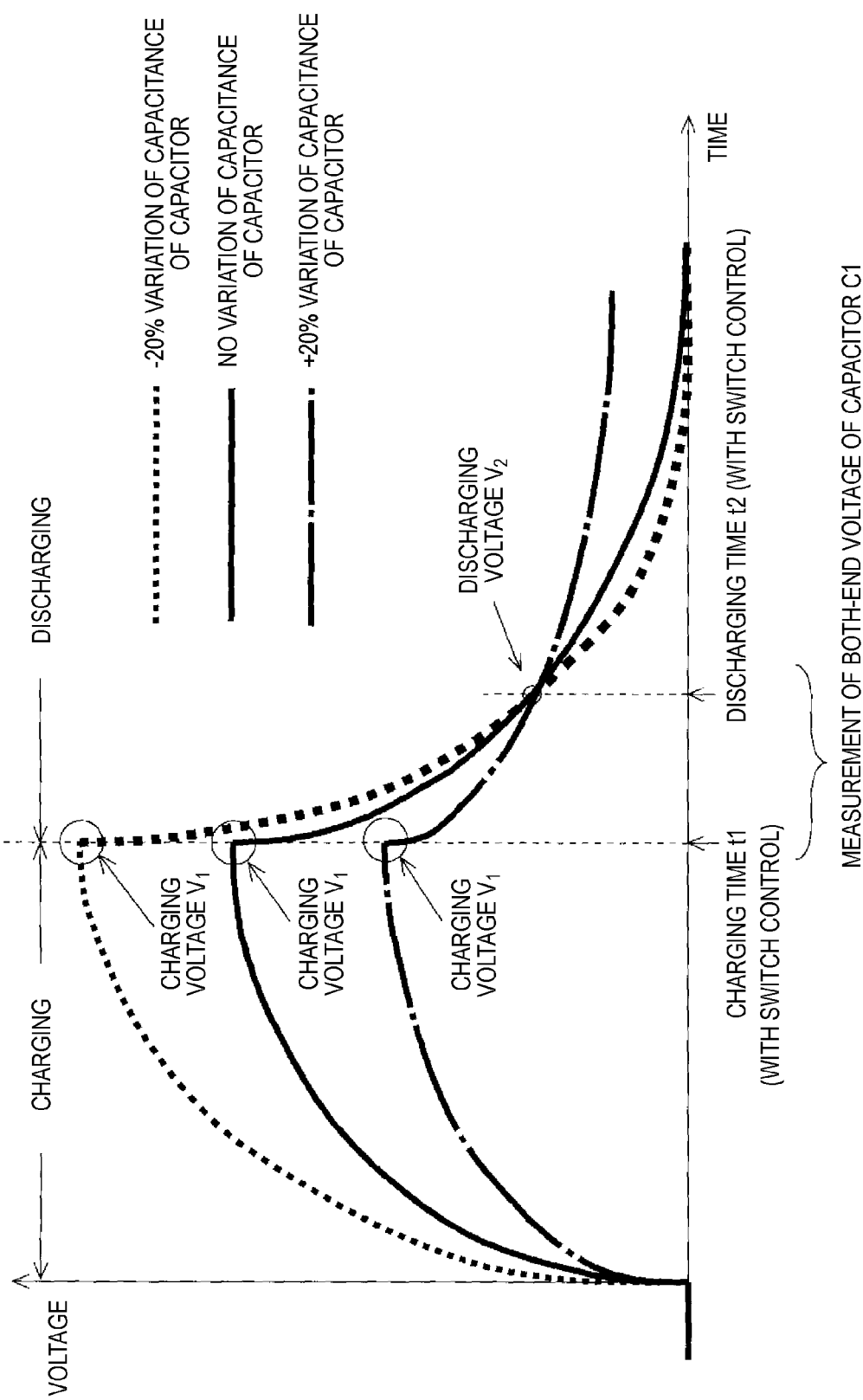

VOLTAGE DETECTING CIRCUIT AND VOLTAGE DETECTING METHOD

CROSS REFERENCE TO RELATED APPLICATIONS

This application claims priority from Japanese Patent Application No. 2015-205533 filed on Oct. 19, 2015, the entire contents of which are incorporated herein by reference.

BACKGROUND OF THE INVENTION

Field of the Invention

The present invention relates to a voltage detecting circuit and a voltage detecting method.

Description of Related Art

In the related art, a battery which supplies power to an electrical apparatus such as an air conditioner is mounted in a vehicle. In addition, as the battery which is mounted in the vehicle maintains appropriate power, the power necessary for various controls of the vehicle is supplied during travel. Accordingly, it is necessary to appropriately monitor a state of the battery.

For example, in order to monitor the state of the battery, a technology of monitoring an insulation state of the battery is provided. Specifically, an insulation measuring device is proposed which monitors the insulation state of the battery by using an insulation measurement circuit of a flying capacitor type (for example, refer to Patent Document 1: JP-B-5613408).

More specifically, a technology described in Patent Document 1 performs measurement after discharging is performed for a predetermined time after charging, thereby removing the amount of detected voltage change due to variation of device characteristics of a capacitor which functions as a flying capacitor.

[Patent Document 1] JP-B-5613408

According to a related art, in a technology of monitoring an insulation state of a battery detects a voltage when a preset discharging time has passed, under the assumption that an amount of detected voltage change due to variation is removed only after discharging is performed for a predetermined time after charging. Accordingly, a discharging voltage is shifted by variation of device characteristics of a capacitor which functions as a flying capacitor, even after discharging is performed for the predetermined time after the charging, and thus accuracy of detection results are decreased. Hence, the technology described in Patent Document 1 can also be affected by variation of the device characteristics of the capacitor which functions as a flying capacitor.

That is, a technology of the related art can be affected by the device characteristics of the capacitor which functions as a flying capacitor, and thus, it is not possible to increase detection accuracy of an application voltage.

SUMMARY

One or more embodiments provide a voltage detecting circuit and a voltage detecting method which are independent of device characteristics of a capacitor which functions as a flying capacitor and can increase detection accuracy of an application voltage.

According to one or more embodiments, an application voltage which is applied to a capacitor is calculated based on an actual capacitance value including a variation value of the capacitor, and thereby effects of the capacitance variation of the capacitor are removed. Accordingly, it is possible to provide a voltage detecting circuit which is independent of device characteristics of a capacitor which functions as a flying capacitor and can increase detection accuracy of an application voltage.

BRIEF DESCRIPTION OF THE DRAWINGS

FIG. 12 is a diagram illustrating an example of a change of the both-end voltage of the capacitor C1.

FIG. 16 is a diagram illustrating an example in which the switch control is performed at the points of time of the charging time t1 and the discharging time t2.

DETAILED DESCRIPTION

Figure 1:
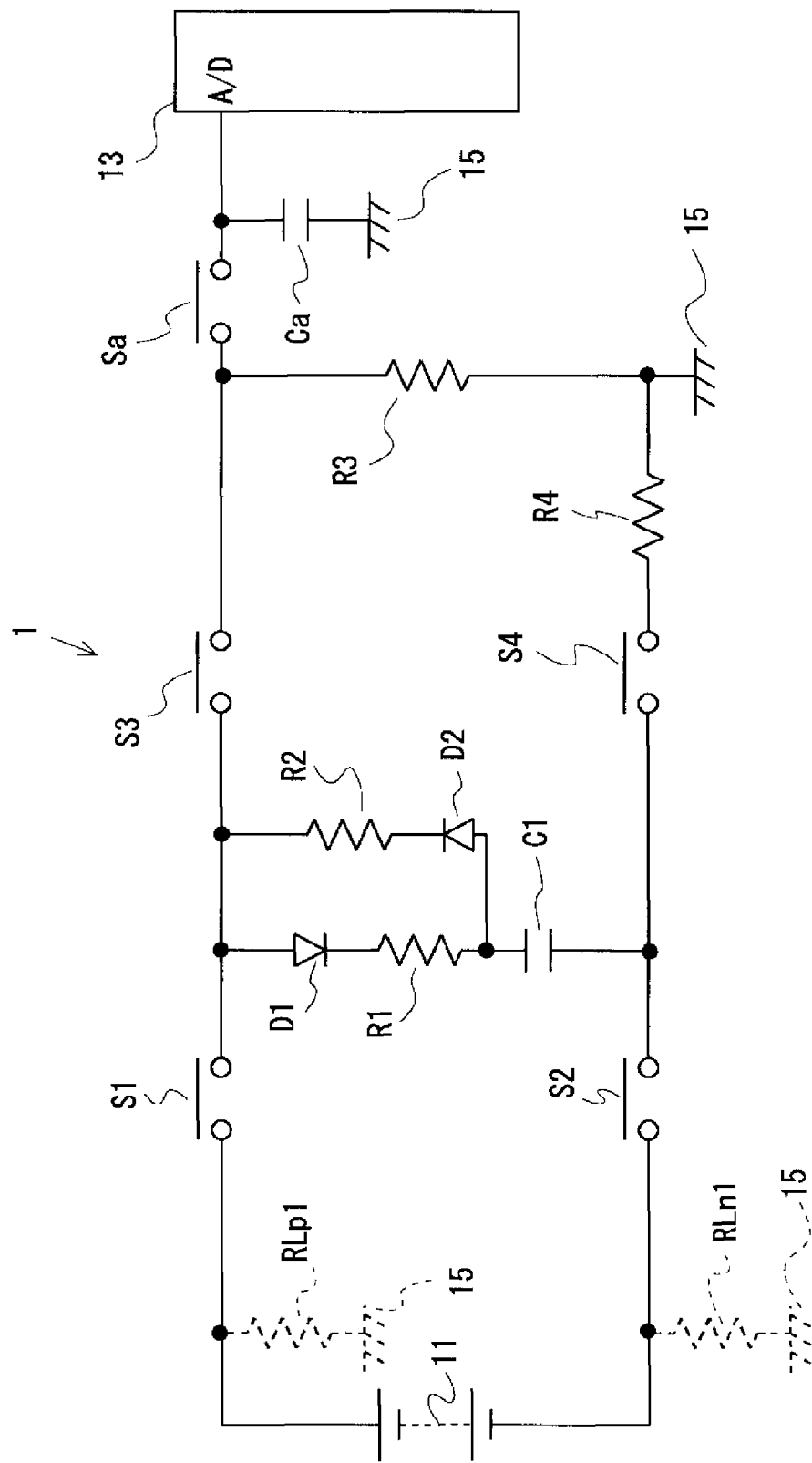
FIG. 1 is a diagram illustrating a circuit configuration example of a voltage detecting circuit according to the present embodiment.

FIG. 1 is a diagram illustrating a circuit configuration example of a voltage detecting circuit 1 according to the present embodiment. As illustrated in FIG. 1, the voltage detecting circuit 1 includes a DC power supply 11, a ground potential unit 15, a capacitor C1, a control unit 13, a charging circuit, and a discharging circuit. In addition, the voltage detecting circuit 1 includes a first switch S1, a second switch S2, a third switch S3, a fourth switch S4, and a fifth switch Sa, and the charging circuit or the discharging circuit is configured by controlling a conducting state and a non-conducting state of the respective switches. In addition, the voltage detecting circuit 1 includes a diode D1, a diode D2, a first resistor R1, a second resistor R2, a third resistor R3, a fourth resistor R4, and a capacitor Ca. The voltage detecting circuit 1 includes a positive polarity side virtual ground resistor RLp1, and a negative polarity side virtual ground resistor RLn1 between the ground potential units 15.

The DC power supply 11 is insulated from the ground potential unit 15. The DC power supply 11 is a high voltage power supply, and is configured by, for example, a battery pack in which a plurality of cells is connected to each other, and is mounted in a vehicle. The DC power supply 11 may be a device which supplies a stable DC voltage, such as a primary battery or a secondary battery. The ground potential unit 15 has a reference potential, and is configured by, for example, a chassis.

The capacitor C1 receives a voltage from the DC power supply 11, and is used for ground detection by functioning as, for example, a flying capacitor.

The charging circuit includes the DC power supply 11 and the capacitor C1, and forms a charging path through which the capacitor C1 is charged. The discharging circuit includes the capacitor C1, and forms a discharging path through which the capacitor C1 discharges. The charging path and the discharging path are assumed to have a plurality of current paths by any combination of the conducting state and the non-conducting state of the first switch S1, the second switch S2, the third switch S3, and the fourth switch S4.

The first resistor R1 is provided between a positive polarity side of the DC power supply 11 and the capacitor C1, and is connected in series to the capacitor C1. The second resistor R2 is provided in parallel with the first resistor R1, and is connected in series to the capacitor C1. A first connection point of the third resistor R3 is connected to the second resistor R2 through the third switch S3, and a second connection point thereof is connected to the ground potential unit 15. A first connection point of the fourth resistor R4 is connected to a negative polarity side of the capacitor C1 through the fourth switch S4, and a second connection point, thereof is connected to the ground potential unit 15.

The first switch S1 is provided between the positive polarity side of the DC power supply 11 and the first resistor R1. The second switch S2 is provided between the negative polarity side of the DC power supply 11 and the negative polarity side of the capacitor C1. The third switch S3 is provided between the first resistor R1 and the second resistor R2, and the ground potential unit 15. The fourth switch S4 is provided between the negative polarity side of the capacitor C1 and the ground potential unit 15.

The fifth switch Sa is provided between the third resistor R3 and the capacitor Ca, and controls whether or not to transfer a voltage to an A/D port of the control unit 13. A positive polarity side of the capacitor Ca is provided between the fifth switch Sa and the A/D port of the control unit 13, and a negative polarity side thereof is connected to the ground potential unit 15. Capacitance of the capacitor C1 is larger than capacitance of the capacitor Ca.

Figure 2:
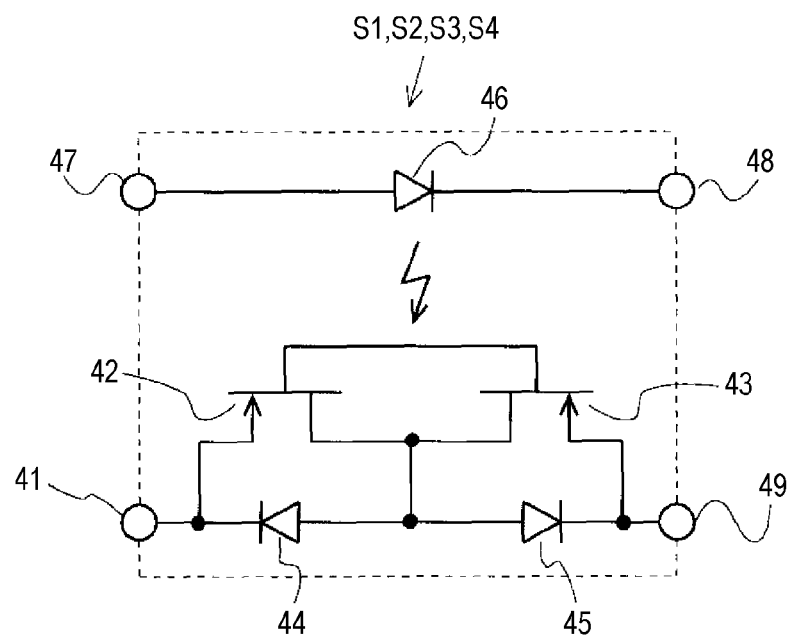
FIG. 2 is a diagram illustrating a specific circuit configuration example of a first switch S1, a second switch S2, a third switch S3, and a fourth switch S4.

Each of the first switch S1, the second switch S2, the third switch S3, and the fourth switch S4 is configured by, for example, a photo MOSFET, and has a high breakdown voltage and insulation characteristics. The first switch S1, the second switch S2, the third switch S3, and the fourth switch S4 will be described in detail with reference to FIG. 2. FIG. 2 is a diagram illustrating a specific circuit configuration example of the first switch S1, the second switch S2, the third switch S3, and the fourth switch S4. The first switch S1, the second switch S2, the third switch S3, and the fourth switch S4 can be collectively referred to as an insulation type switch S.

As illustrated in FIG. 2, the insulation type switch S includes a pair of photo transistors 42 and 43 which are connected in series so as to have a reverse polarity to each other, between a pair of electric path terminals 41 and 49, and diodes 44 and 45 are connected in parallel to the photo transistors 42 and 43 so as to have a reverse polarity to each other. In addition, a light emitting diode 46 is connected between a pair of drive terminals 47 and 48. The light emitting diode 46 is electrically insulated from the respective elements, such as the photo transistors 42 and 43 and the diodes 44 and 45, and is disposed with a relative positional relationship so as to be optically coupled to the photo transistors 42 and 43.

If a drive current is supplied between the pair of drive terminals 47 and 48, the light emitting diode 46 emits light. Thereby, the photo transistors 42 and 43 are turned on, and thus, the pair of the electric path terminals 41 and 49 are electrically connected to each other. That is, the insulation type switch S is closed.

Meanwhile, if the drive current which is supplied between the pair of drive terminals 47 and 48 is blocked, light emission of the light emitting diode 46 is stopped. Thereby, the insulation type switch S is opened. The circuit configuration example of FIG. 2 is a photo-coupler type insulation switch which can be applied even in a case of AC, and may have a configuration of right half or left half thereof in a case where of DC only, in order for easy understanding.

The fifth switch Sa may have a discrete configuration which uses a relatively inexpensive low voltage analog switch or a semiconductor switching element such as an FET.

Figure 3:
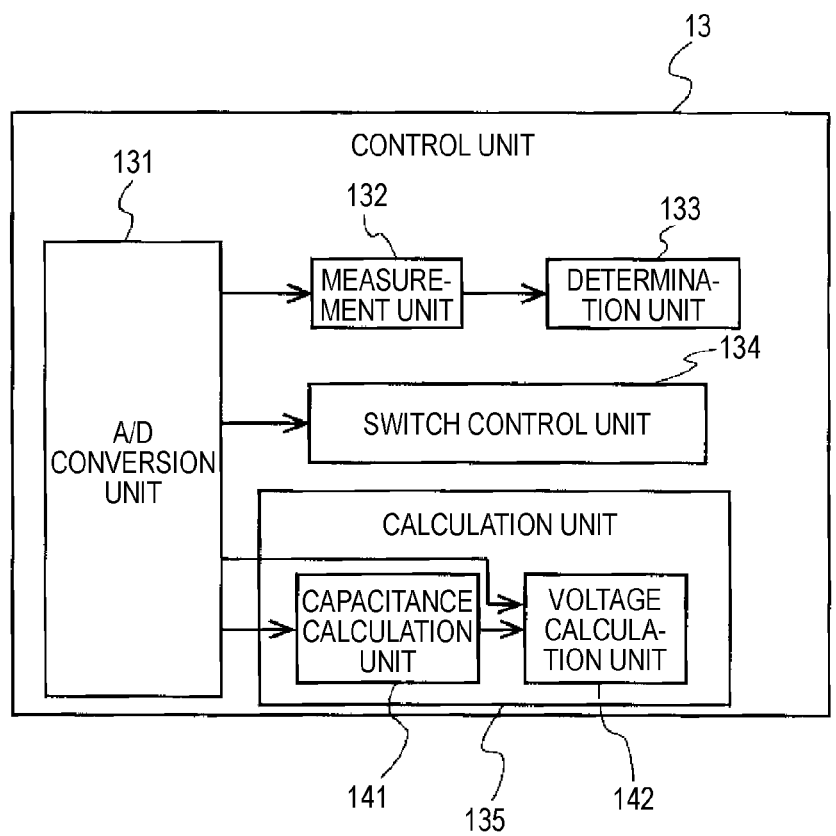
FIG. 3 is a diagram illustrating a functional configuration example of a control unit 13.
Figure 4:
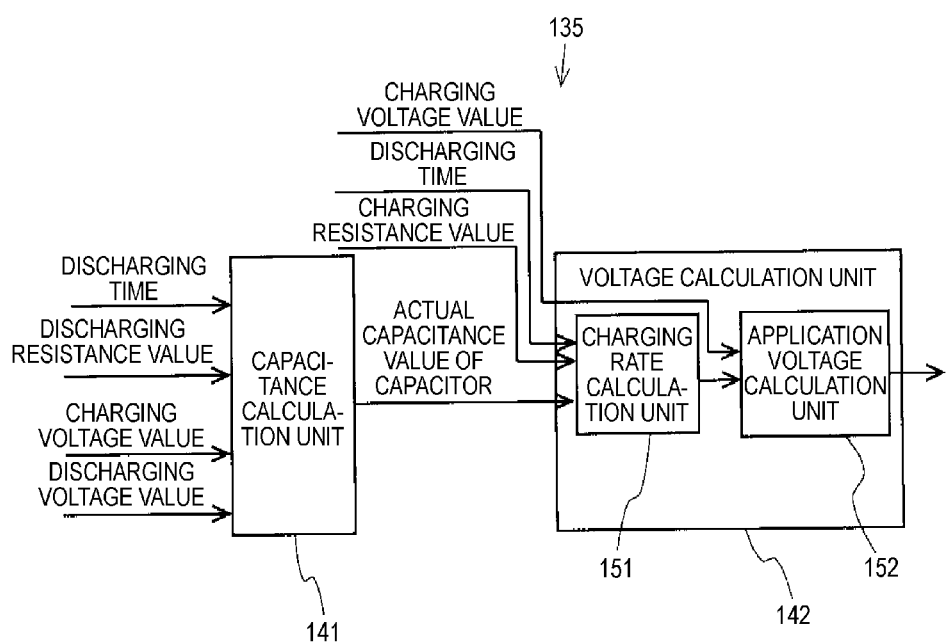
FIG. 4 is a diagram illustrating a detailed example of a functional configuration of a calculation unit 135.
Figure 5:
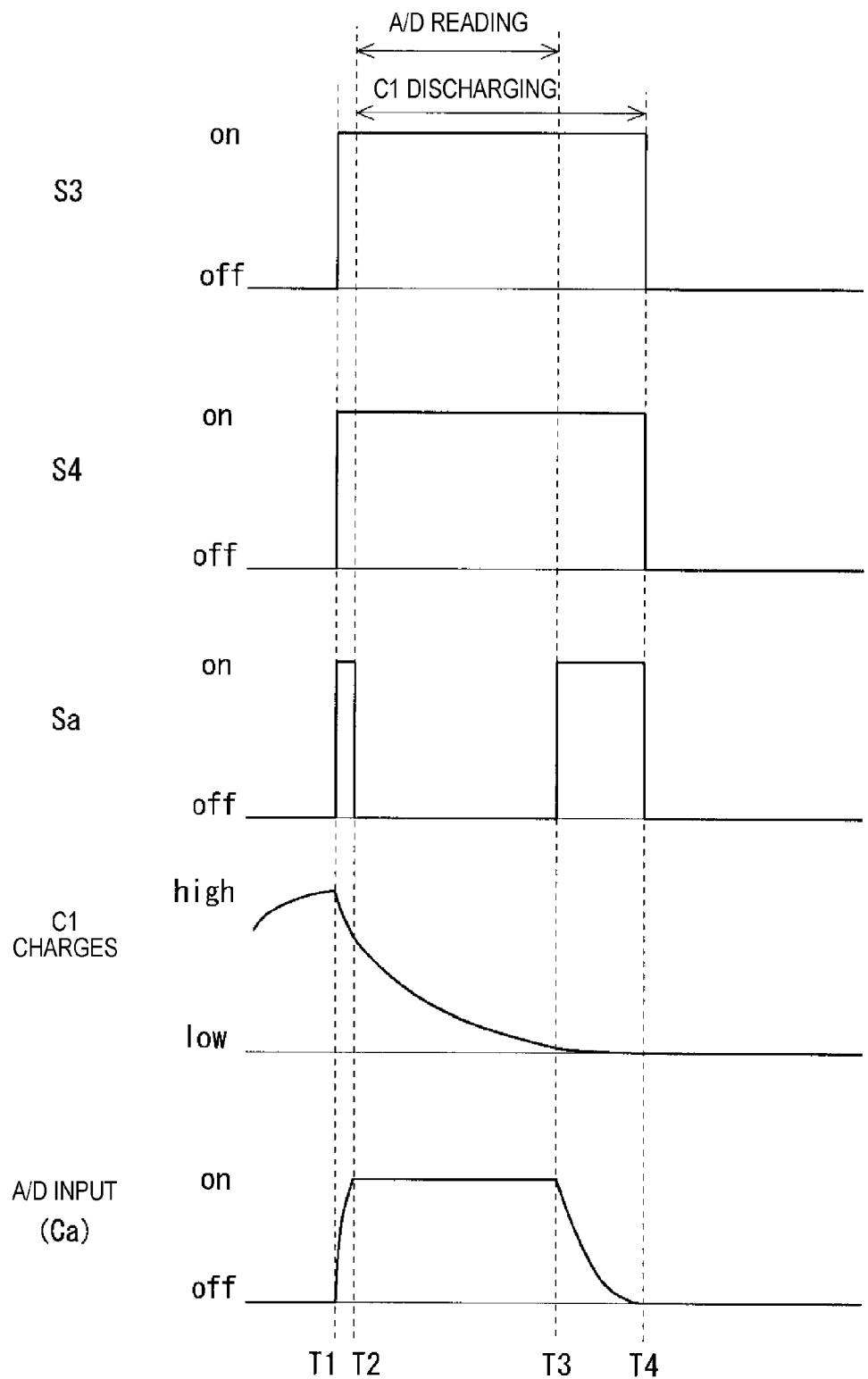
FIG. 5 is a time chart of read processing of an A/D port in an insulation measurement circuit of a flying capacitor type.
Figure 6:
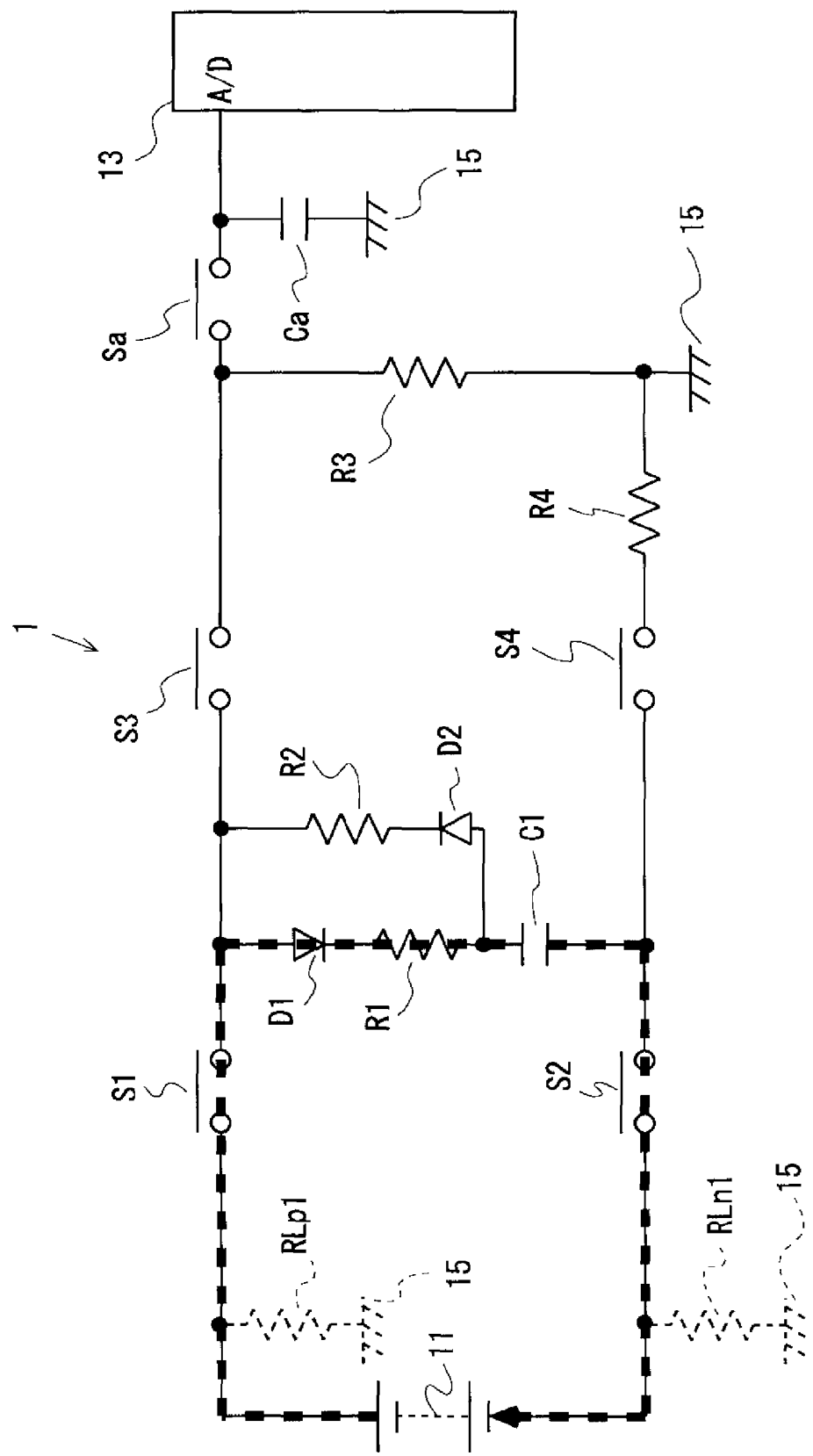
FIG. 6 is a diagram illustrating a closed circuit configuration example when a voltage of a DC power supply 11 is applied to a capacitor C1.
Figure 7:
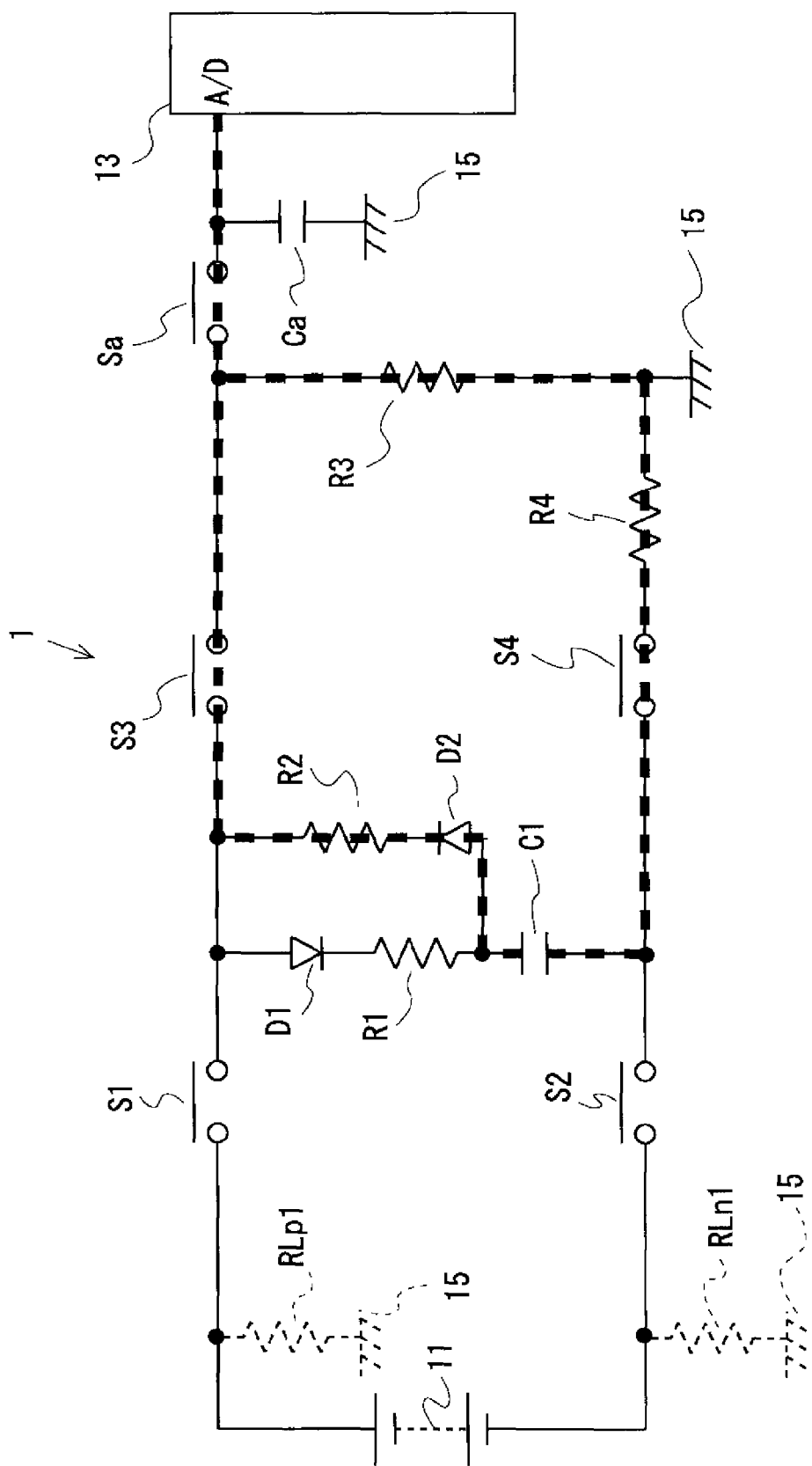
FIG. 7 is a diagram illustrating a closed circuit configuration example when a voltage which is applied to the capacitor C1 is measured.
Figure 8:
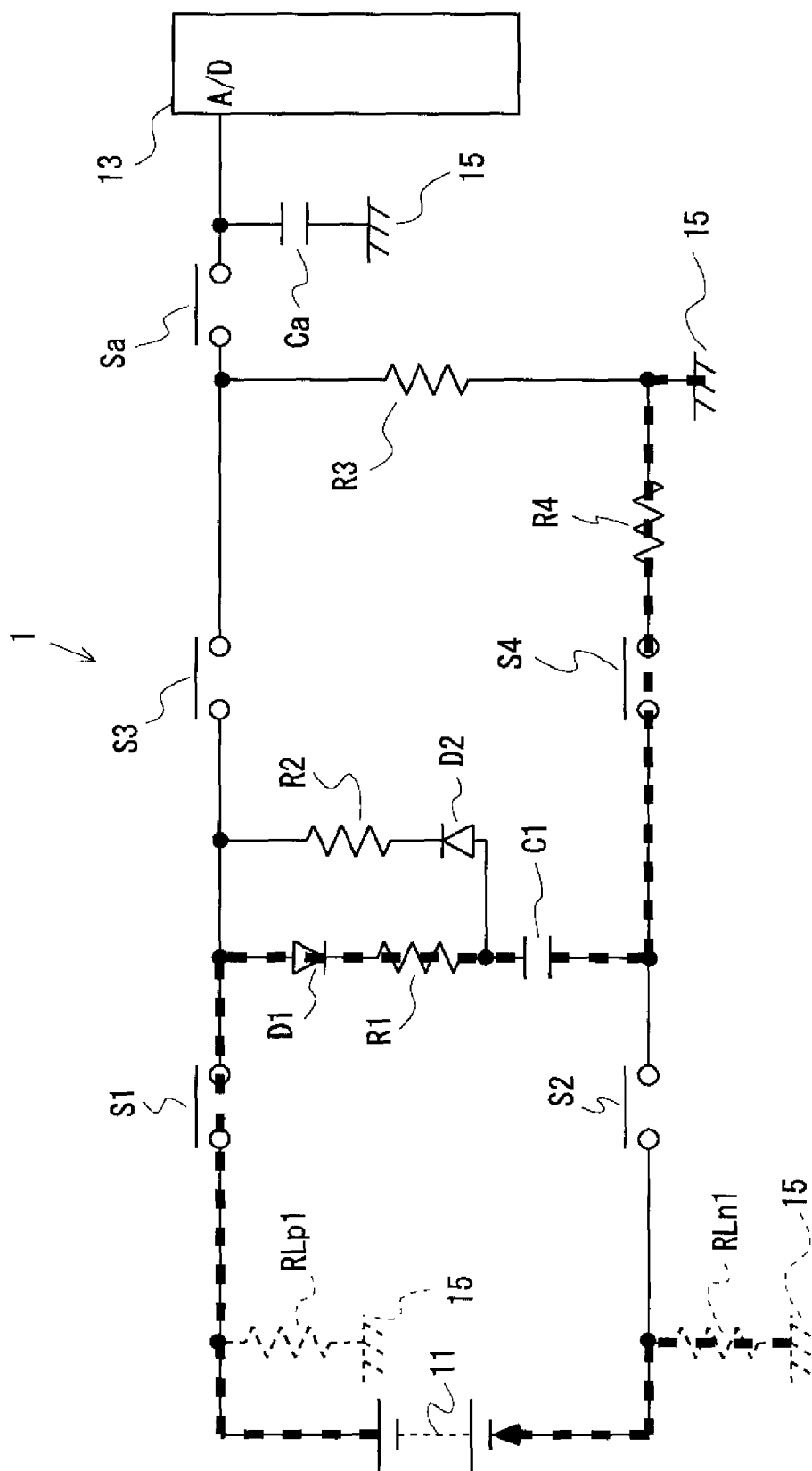
FIG. 8 is a diagram illustrating a closed circuit configuration example when voltage of a negative polarity side virtual ground resistor RLn1 is applied to the capacitor C1.
Figure 9:
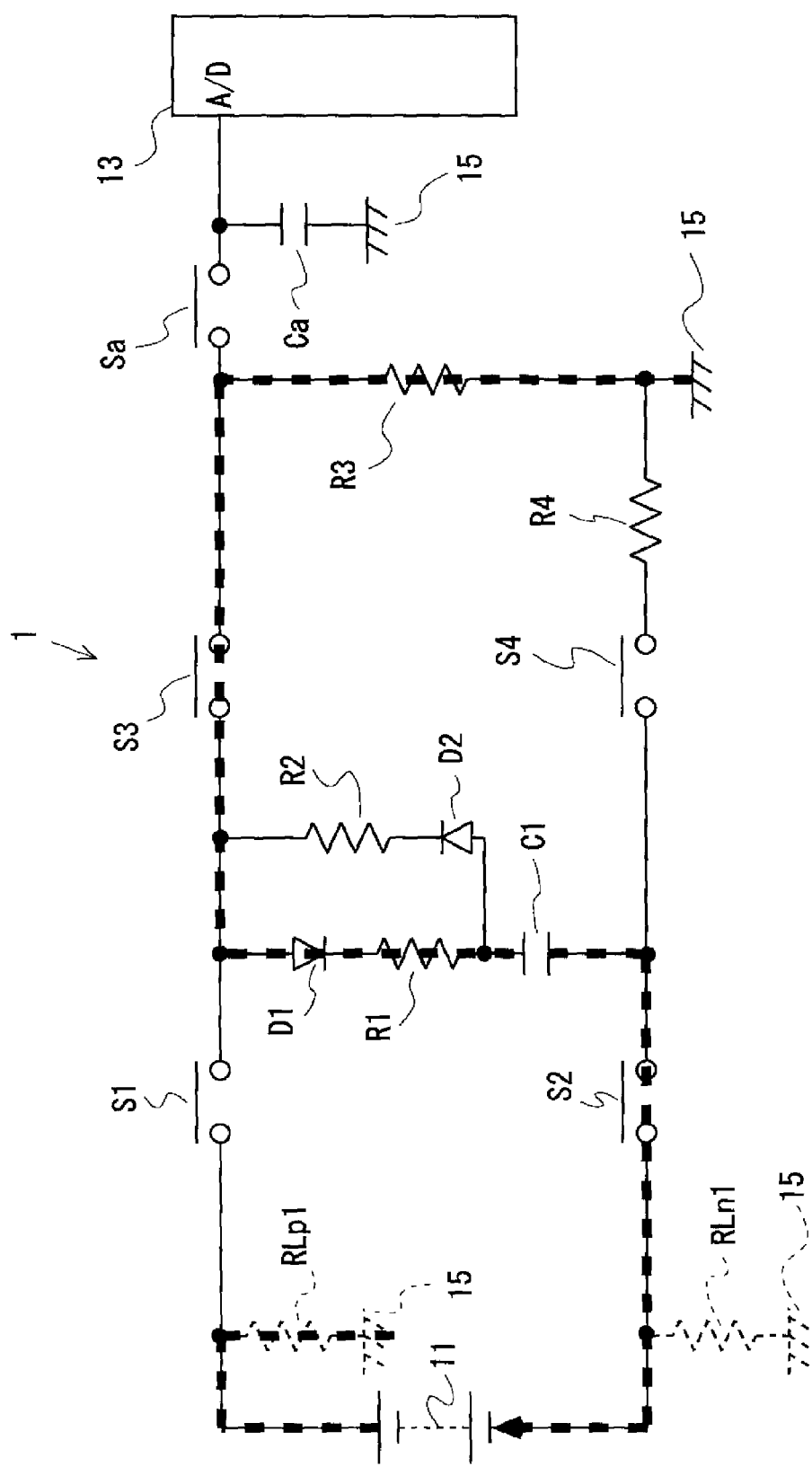
FIG. 9 is a diagram illustrating a closed circuit configuration example when a voltage of a positive polarity side virtual ground resistor RLp1 is applied to the capacitor C1.

Next, details of the control unit 13 and a control example thereof will be described in detail with reference to FIG. 3 to FIG. 9. FIG. 3 is a diagram illustrating a functional configuration example of the control unit 13. FIG. 4 is a diagram illustrating a detailed example of a functional configuration of a calculation unit 135. FIG. 5 is a time chart of read processing of the A/D port in an insulation measurement circuit of a flying capacitor type. FIG. 6 is a diagram illustrating a closed circuit configuration example when a voltage of the DC power supply 11 is applied to the capacitor C1. FIG. 7 is a diagram illustrating a closed circuit configuration example when a voltage which is applied to the capacitor C1 is measured. FIG. 8 is a diagram illustrating a closed circuit configuration example when a voltage of the negative polarity side virtual ground resistor RLn1 is applied to the capacitor C1. FIG. 9 is a diagram illustrating a closed circuit configuration example when a voltage of the positive polarity side virtual ground resistor RLp1 is applied to the capacitor C1.

The control unit 13 controls charging and discharging of the capacitor C1, and can be realized by a microcontroller which is mainly configured with a CPU, a ROM, a RAM, and an I/O interface that are not illustrated. As the control unit 13 executes a predetermined control program, as illustrated in FIG. 3, various functions of an A/D conversion unit 131, a measurement unit 132, determination unit 133, a switch control unit 134, the calculation unit 135, and the like, are performed.

The A/D conversion unit 131 has a function of converting an analog signal which is acquired through the A/D port into a digital signal.

The switch control unit 134 controls the first switch S1, the second switch S2, the third switch S3, the fourth switch S4, and the fifth switch Sa.

Specifically, the switch control unit 134 turns on the first switch S1 and the second switch S2, and thereby a charging path is formed. For example, the charging path including the first resistor R1 is formed, as illustrated in FIG. 6.

In addition, the switch control unit 134 turns on the first switch S1 and the fourth switch S4, and thereby the negative polarity side of the DC power supply 11 is connected to the ground potential unit 15 through the negative polarity side virtual ground resistor RLn1, and the DC power supply 11, the first switch S1, the first resistor R1, the capacitor C1, the fourth switch S4, and the ground potential unit 15 are electrically connected to each other. For example, as illustrated in FIG. 8, a current path including the first resistor R1 and the fourth resistor R4 is formed.

In addition, the switch control unit 134 turns on the second switch S2 and the third switch S3, and thereby the positive polarity side of the DC power supply 11 is connected to the ground potential unit 15 through the positive polarity side virtual ground resistor RLp1, and the DC power supply 11, the ground potential unit 15, the third switch S3, the first resistor R1, and the capacitor C1 are electrically connected to each other. For example, as illustrated in FIG. 9, a current path including the first resistor R1 and the third resistor R3 is formed.

In addition, the switch control unit 134 turns on the third switch S3 and the fourth switch S4, and thereby a discharging path is formed. For example, as illustrated in FIG. 7, a discharging path including the second resistor R2, the third resistor R3, and the fourth resistor R4 is formed.

In order for the measurement unit 132 to measure a voltage which is generated by discharging electric charges accumulated in the capacitor C1 through the A/D port, the third switch S3, the fourth switch S4, and the fifth switch Sa are controlled by timing illustrated in FIG. 5.

Specifically, by control of the switch control unit 134, the first switch S1 and the second switch S2, the first switch S1 and the fourth switch S4, or the second switch S2 and the third switch S3 are turned off, and the third switch S3 and the fourth switch S4 are turned on, and the fifth switch Sa is turned on in a short time, at a point of time T1. Here, the short time indicates a period between T1 and T2, and, for example, 200 to 300 μs.

Thereafter, during a period taken until the fifth switch Sa is turned on again by the control of the switch control unit 134, that is, during a period between T2 and the measurement unit 132 measures a charging voltage $V_1$ of the capacitor C1 according to a voltage of the DC power supply 11.

In addition, after the capacitor C1 and the capacitor Ca are completely discharged, the third switch S3 and the fourth switch S4 are turned off, and the first switch S1 and the second switch S2, the first switch S1 and the fourth switch S4, or the second switch S2 and the third switch S3 are turned on by the control of the switch control unit 134.

The measurement unit 132 measures the both-end voltage of the capacitor C1. Specifically, the measurement unit 132 measures the charging voltage $V_1$ which is charged in the capacitor C1, in a case of being charged through the charging path. The measurement unit 132 measures a discharging voltage $V_2$ which is discharged from the capacitor C1, in a case of being discharged after the charging path is switched to the discharging path.

It does not have to take long time to determine whether or not an apparatus mounted on a vehicle has abnormality. Accordingly, it is not proper to measure a voltage after the capacitor C1 is fully charged. Hence, when the capacitor C1 is measured without being fully charged, the capacitor C1 needs to be converted as a known value. That is, the measurement unit 132 performs a measuring method of converting a measured value in a certain time into an application voltage $V_0$, without fully charging the capacitor C1. However, the capacitor C1 easily varies due to various factors, such as aging, ambient temperature, or an individual difference. Accordingly, in the present embodiment, an actual capacitance value C of the capacitor C1 which is converted by the charging voltage $V_1$ and the discharging voltage $V_2$ is used for converting a capacitance value into the actual capacitance value C including variation of the capacitor C1. That is, the actual capacitance value C of the capacitor C1 is obtained from a voltage between two points at a certain time.

Specifically, the voltage between the two points is obtained by controlling a current path of the voltage detecting circuit 1 which can perform ground detection. Accordingly, outline of a configuration of the voltage detecting circuit 1 which performs the ground detection will be first described, and subsequently, a configuration of the voltage detecting circuit 1 which obtains the actual capacitance value C of the capacitor C1 from a voltage between two points will be described.

The measurement unit 132 measures a charging voltage VC1n of the capacitor C1. The measurement unit 132 measures a discharging voltage V2_C1n of the capacitor C1. The measurement unit 132 measures a charging voltage VC1p of the capacitor C1. The measurement unit 132 measures a discharging voltage V2_C1p of the capacitor C1.

The determination unit 133 determines whether or not the DC power supply 11 is in a ground state. Specifically, the determination unit 133 determines whether or not the DC power supply 11 is in a ground state, based on the charging voltage $V_1$, the charging voltage VC1n, and the charging voltage VC1p which are measured by the measurement unit 132.

Here, the ground state is determined based on a value obtained by an insulation resistance conversion equation which is represented by Equation (1).

$$\text{insulation resistance conversion equation} = \frac{(V_{c1p} + V_{c1n})}{V_2} \quad (1)$$

The calculation unit 135 calculates a voltage value of the DC power supply 11, that is, the application voltage $V_0$, based on the actual capacitance value C of the capacitor C1 which is obtained by the both-end voltage of the capacitor C1 at a first time and the both-end voltage of the capacitor C1 at a second time. As described above, the both-end voltage of the capacitor C1 is the charging voltage $V_1$ or the discharging voltage $V_2$. Here, the first time means, for example, charging time t1. In addition, the second time means, for example, discharging time t2. That is, time after a certain time passes from the first time may be the second time.

The calculation unit 135 includes a capacitance calculation unit 141 and a voltage calculation unit 142. The capacitance calculation unit 141 obtains the actual capacitance value C of the capacitor C1, based on the charging voltage $V_1$ and the discharging voltage $V_2$.

For example, the charging voltage $V_1$ is represented by Equation (2), based on the application voltage $V_0$, the charging time t1, charging resistance R_charge, and the actual capacitance value C of the capacitor C1. In a case of FIG. 6, the charging resistance R_charge is the first resistor R1.

$$V_1 = V_0 \times (1 - \exp^{(-t1/C \times R\_charge)}) \tag{2}$$

In addition, the discharging voltage $V_2$ is represented by Equation (3), based on the charging voltage $V_1$, the discharging time t2, discharging resistance R_discharge, and the actual capacitance value C of the capacitor C1. In a case of FIG. 7 the discharging resistance R_discharge is a combined resistor of the second resistor R2, the third resistor R3, and the fourth resistor R4.

$$V_2 = V_1 \times (\exp^{(-t2/C \times R\_discharge)}) \tag{3}$$

$$V_2 = V_1 \times (\exp^{(-t2/C \times R\_discharge)})$$

Equation (4) derived from Equation (2) and Equation (3).

$$C = T_2 \div (R\_Discharge \times \ln(V_1/V_2)) \tag{4}$$

Subsequently, a charging rate is obtained from the actual capacitance value C of the capacitor C1 which is obtained by Equation (4). A both-end voltage V(t) of the capacitor C1 is represented by Equation (5), using a voltage value of the DC power supply 11, that is, the application voltage $V_0$.

$$V(t) = V_0 \left( 1 - e^{\frac{t}{C \times R\_charge}} \right) \tag{5}$$

Figure 10:
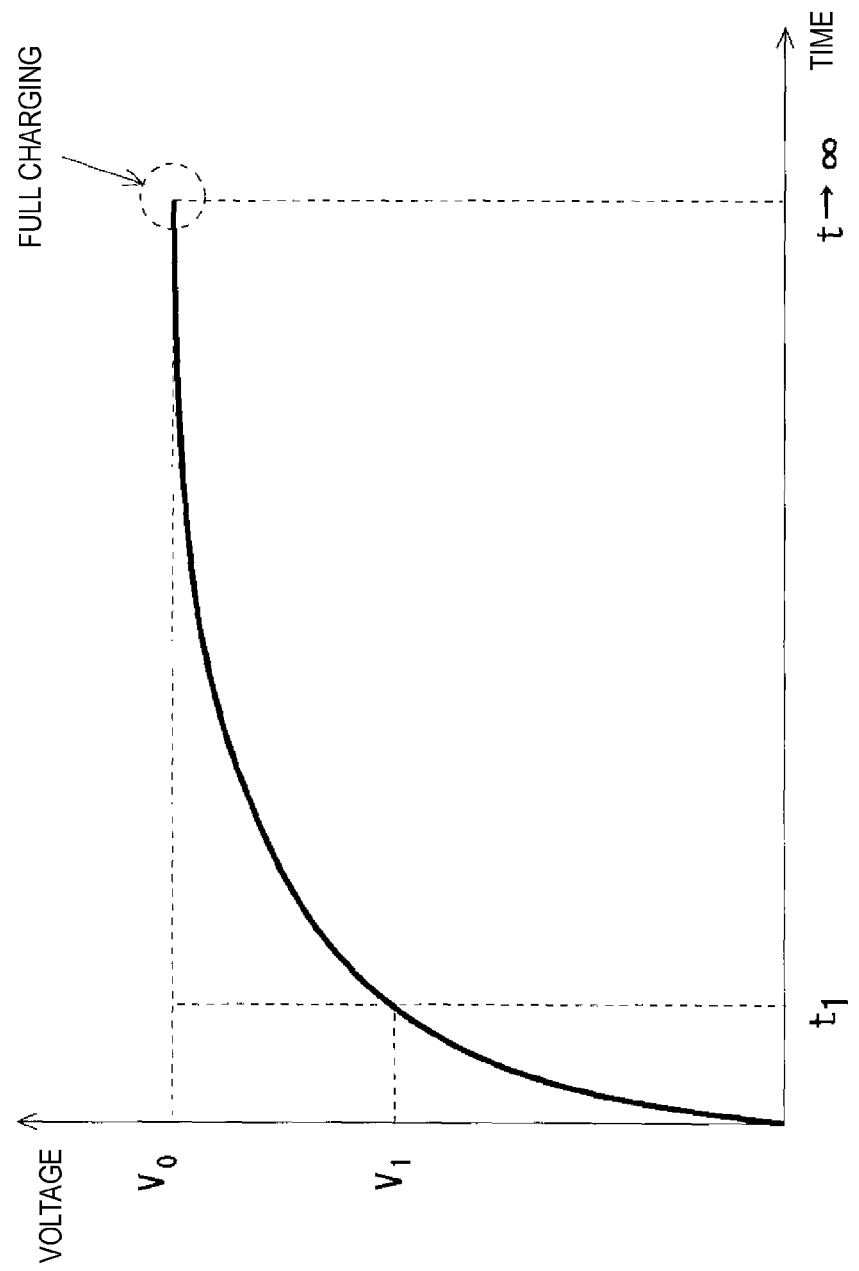
FIG. 10 is a diagram illustrating a change of a both-end voltage V(t) of the capacitor C1 according to charging of the capacitor C1.

The both-end voltage V(t) of the capacitor C1 changes as illustrated in FIG. 10, while being charged. FIG. 10 is a diagram illustrating a change of the both-end voltage V(t) of the capacitor C1 according to charging of the capacitor C1. As illustrated in FIG. 10, it takes time to fully charge the capacitor C1, and thus, the voltage value of the DC power supply 11, that is, the application voltage $V_0$ is converted based on a value measured at a certain time, for example, t1, as described above.

Here, when t=t1, if V(t1)=$V_1$, $V_1$ is obtained by Equation (6). Here, t1 is a known value, and $V_1$ is measured value.

$$V_1 = V_0 \left( 1 - e^{\frac{t_1}{C \times R\_charge}} \right) \tag{6}$$

Following Equation (7) is derived from Equation (6).

$$V_0 = \frac{V_1}{1 - e^{-\frac{t_1}{C \times R\_charge}}} \tag{7}$$

In Equation (7), the actual capacitance value C of the capacitor C1 is obtained by measuring two points, and is a known value. The charging resistance R_charge is obtained from a circuit configuration of the voltage detecting circuit 1, and is a known value. t1 is a value which is set on a measurement side, and thus, t1 is a known value. Hence, a value of Equation (8) which is in a denominator of Equation (7) can be obtained.

$$1 - e^{\frac{t_1}{C \times R\_charge}} \tag{8}$$

If Equation (8) is defined by a charging rate, Equation (7) is represented by Equation (9).

$$V_0 = \frac{V_1}{\text{charging rate}} \tag{9}$$

Hence, the charging rate is a value only depending upon t1, the charging resistance R_charge, and the actual capacitance value C of the capacitor C1, and can be irrelevant to the application voltage $V_0$ and the charging voltage $V_1$. That is, the charging rate is specified by parameters which are represented by Equation (10).

$$\text{Charging rate } (t_1, C, R\_charge) \tag{10}$$

Accordingly, in the present embodiment, the actual capacitance value C of the capacitor C1 is obtained by the measurement of two points, the application voltage $V_0$ is obtained by V(t1)=$V_1$ when t=t1, and thus, the charging rate is first calculated based on the parameters which are represented by Equation (10). The charging rate may be obtained by map conversion.

Subsequently, sequence of obtaining the application voltage $V_0$ which is a voltage value of the DC power supply 11 will be described in detail. For example, as represented by Equation (11) and Equation (12), a case where a charging voltage is V(0.3)=78.7 (V) at t=0.3 (s) and the actual capacitance value C of the capacitor C1 and the charging resistance R_charge are represented by Equation (13) and Equation (14), is assumed.

$$t = 0.3 (S) \tag{11}$$

$$V(0.3) = 78.7(V) \tag{12}$$

$$C = 3.0 \times 10^{-6} (F) \tag{13}$$

$$R = 200000 (\Omega) \tag{14}$$

Calculation is performed by Equation (15), based on each parameter described above.

$$V_0 = \frac{V(t_1)}{\text{charging rate}(t_1, C, R_{charge})} \tag{15}$$

More specifically, the charging rate is calculated as represented by Equation (16). Hence, the application voltage $V_0$ is obtained as represented by Equation (17), and the application voltage $V_0$ which is the voltage value of the DC power supply 11 becomes approximately 200 (V).

$$1 - e^{\frac{0.3}{2 \cdot 10^5 \cdot 3 \cdot 10^{-6}}} = 1 - e^{-0.5} \cong 0.39347 \tag{16}$$

$$V_0 = \frac{78.7}{0.39347} \cong 200[V] \tag{17}$$

That is, the voltage calculation unit 142 calculates the application voltage $V_0$ which is the voltage value of the DC power supply 11, based on the actual capacitance value C of the capacitor C1 which is obtained by the capacitance calculation unit 141. Specifically, the voltage calculation unit 142 includes a charging rate calculation unit 151 and an application voltage calculation unit 152. The charging rate is obtained by the charging rate calculation unit 151, and the application voltage $V_0$ is obtained by the application voltage calculation unit 152.

As described above, the charging voltage $V_1$ and the discharging voltage $V_2$ are used for calculating the application voltage $V_0$. That is, the application voltage $V_0$ which is the voltage value of the DC power supply 11 is obtained by using a current path which does not included a ground path, and a value that is measured at the time of a $V_0$ measurement mode which will be below is used.

Figure 11:
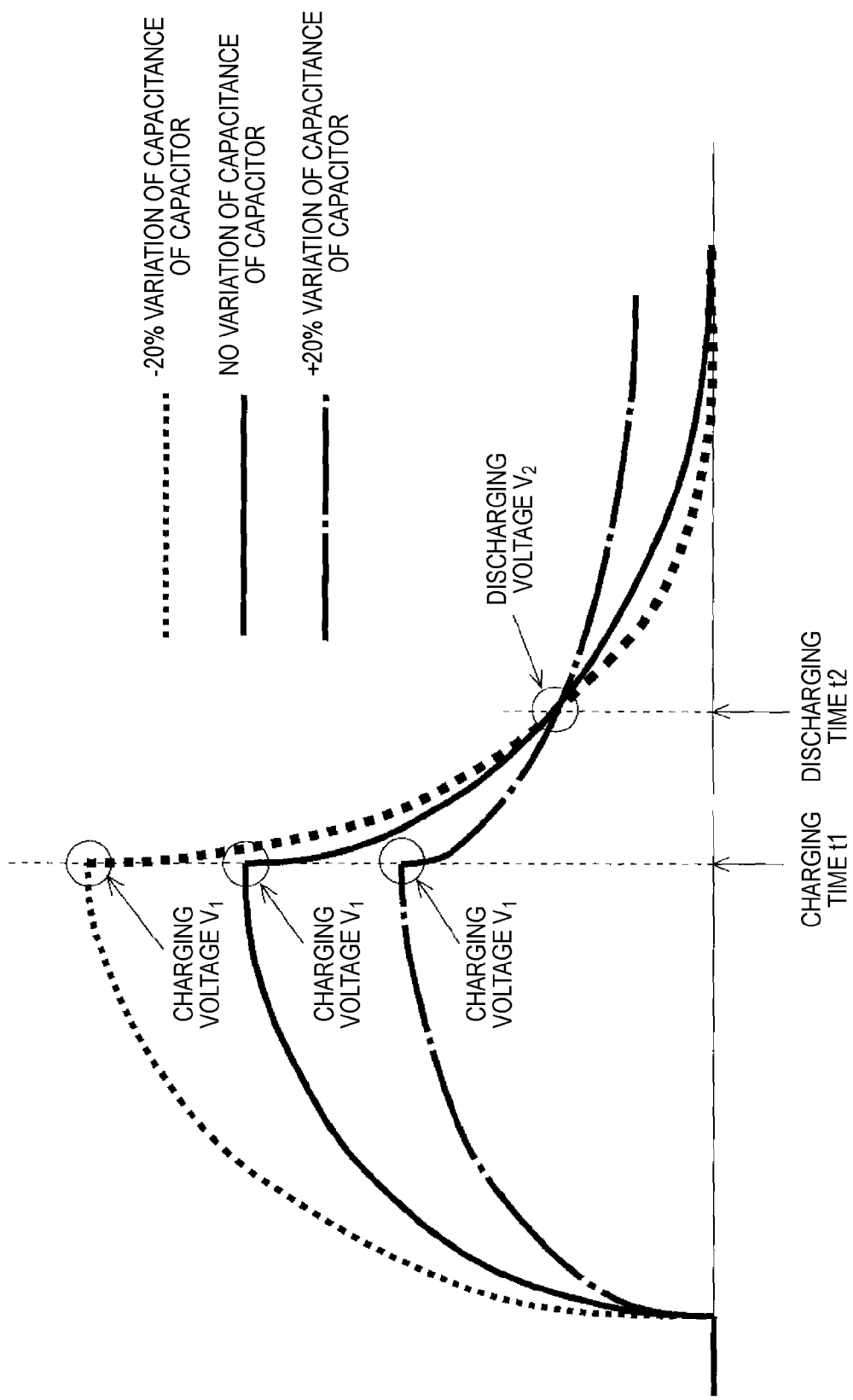
FIG. 11 is a diagram illustrating a charging voltage V1 in a case where device characteristics of the capacitor C1 vary.

FIG. 11 is a diagram illustrating the charging voltage $V_1$ in a case where device characteristics of the capacitor C1 varies. As illustrated in FIG. 11, the actual capacitance value C of the capacitor C1 can vary. Accordingly, in the related art, in a case where the discharging time t2 passes, the discharging voltage $V_2$ is measured, but actually, the actual capacitance value C of the capacitor C1 can vary even at a point of time when the discharging time t2 passes.

However, as described in the present embodiment, effects of the amount of capacitance variation of the capacitor C1 are excluded, as long as the actual capacitance value C of the capacitor C1 is converted. FIG. 12 is a diagram illustrating an example of a change of the both-end voltage of the capacitor C1. For example, as illustrated in FIG. 12, the aforementioned processing is performed based on the charging voltage and the discharging voltage $V_2$, thereby, the actual capacitance value C of the capacitor C1 can be obtained, and the application voltage $V_0$ can be obtained. In addition, the actual capacitance value C of the capacitor C1 can be obtained from a voltage between two points by using Equation (2) to Equation (4) for a predetermined time, and thus, the actual capacitance value C of the capacitor C1 may be obtained and the application voltage $V_0$ may be obtained, based on a discharging voltage V21 and a discharging voltage V22, as illustrated in FIG. 12. In the same manner, the actual capacitance value C of the capacitor C1 may be obtained and the application voltage $V_0$ may be obtained, based on a charging voltage V11 and a charging voltage V12, as illustrated in FIG. 12.

Figure 13:
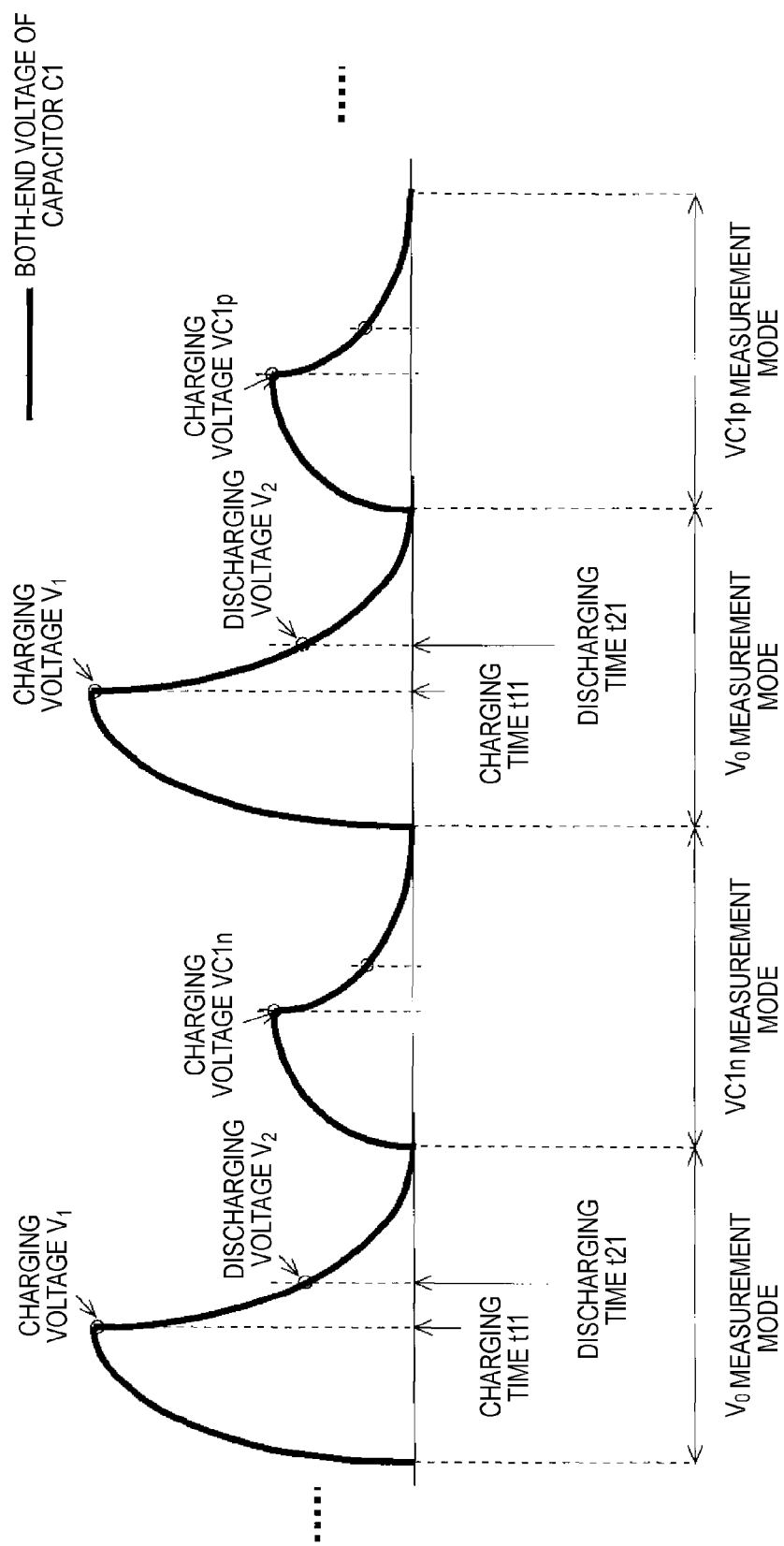
FIG. 13 is a diagram illustrating an example of a change of the both-end voltage of the capacitor C1 in cases of a $V_0$ measurement mode, a $VC1n$ measurement mode, and a $VC1p$ measurement mode.

FIG. 13 is a diagram illustrating an example of a change of the both-end voltage of the capacitor C1 in cases of a $V_0$ measurement mode, a VC1$n$ measurement mode, and a VC1$p$ measurement mode. As described above, the actual capacitance value C of the capacitor C1 can be obtained from a voltage between two points for a predetermined time, at the time of the $V_0$ measurement mode.

Figure 14:
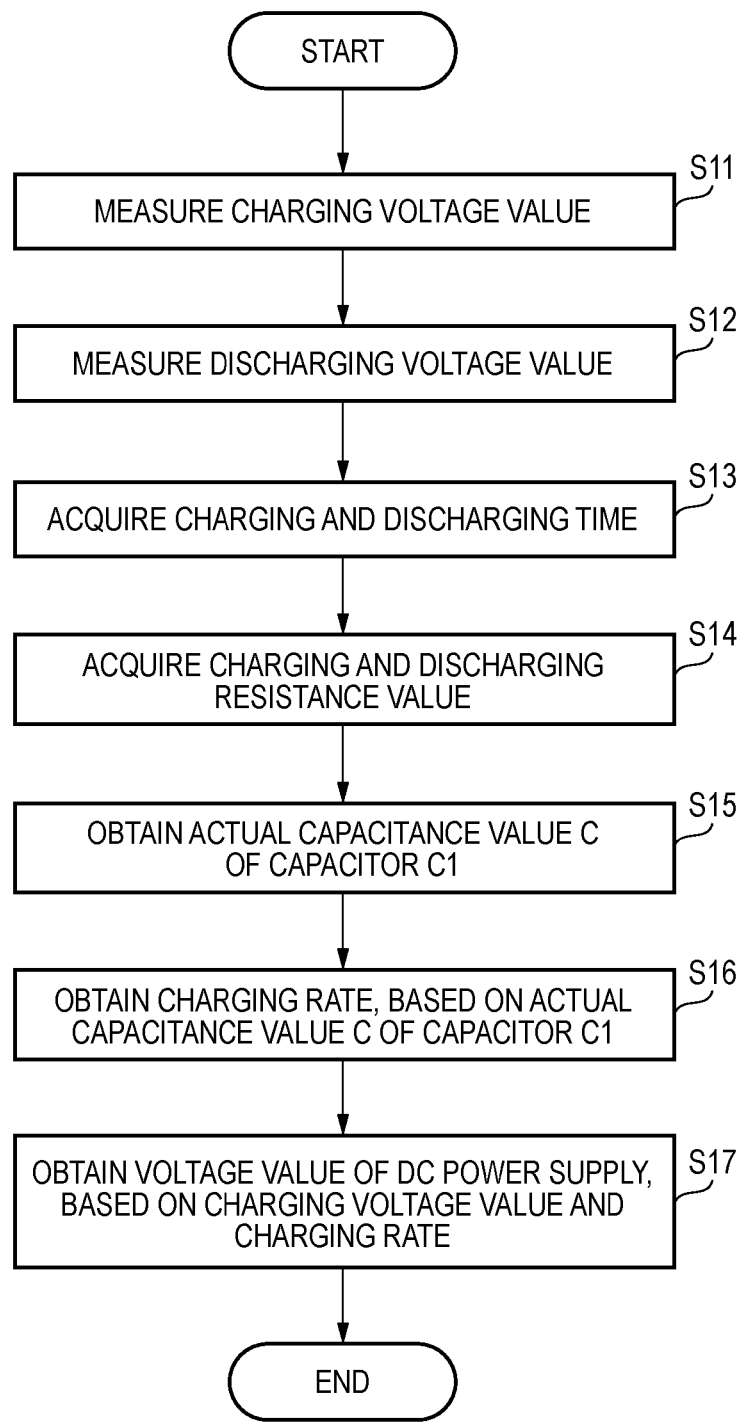
FIG. 14 is a flowchart illustrating a process of obtaining an application voltage V0 based on an actual capacitance value C of the capacitor C1.

FIG. 14 is a flowchart illustrating a process of obtaining the application voltage $V_0$ based on the actual capacitance value C of the capacitor C1.

The control unit 13 measures the charging voltage $V_1$ (step S11), and measures the discharging voltage $V_2$ (step S12). The control unit 13 acquires charging and discharging times, that is, the charging time t1 and the discharging time t2 (step S13). The control unit 13 acquires charging and discharging resistance values, that is, resistance values of each of the charging resistance R_charge and the discharging resistance R_discharge (step S14). The control unit 13 obtains the actual capacitance value C of the capacitor C1 (step S15), obtains a charging rate, based on the actual capacitance value C of the capacitor C1 (step S16), and obtains the application voltage $V_0$ which is a voltage value of the DC power supply 11, based on the charging voltage $V_1$ and the charging rate (step S17).

As described above, the voltage detecting circuit 1 obtains the actual capacitance value C of the capacitor C1, using the both-end voltage of the capacitor C1 corresponding to the first time and the both-end voltage of the capacitor C1 corresponding to the second time. Thereby, the obtained actual capacitance value C of the capacitor C1 includes variation of the capacitor C1. The voltage detecting circuit 1 calculates the application voltage $V_0$ which is the voltage value of the DC power supply 11, based on the obtained actual capacitance value C of the capacitor C1. Hence, the calculated application voltage $V_0$ includes a variation value of the capacitor C1, thereby not being affected by capacitance variation of the capacitor C1. Thereby, the voltage detecting circuit 1 is independent of device characteristics of the capacitor C1, and can obtain the application voltage $V_0$. Hence, the voltage detecting circuit 1 can increase detection accuracy of the application voltage $V_0$.

In other words, the voltage detecting circuit 1 calculates the application voltage $V_0$, based on the actual capacitance value C including the variation value of the capacitor C1, thereby not being affected by the capacitance variation of the capacitor C1. Accordingly, the voltage detecting circuit 1 is independent of the device characteristics of the capacitor C1 which functions as a flying capacitor, and can increase the detection accuracy of the application voltage $V_0$.

In addition, the voltage detecting circuit 1 can form the path including the negative polarity side virtual ground resistor RLn1, when forming a charging path. In addition, the voltage detecting circuit 1 can also form the path including the positive polarity side virtual ground resistor RLp1, when forming a charging path. Hence, the voltage detecting circuit 1 can determine whether or not the DC power supply 11 is in a ground state in the same manner as in the related art.

As describe above, a voltage detecting circuit 1 according to the present embodiment includes a ground potential unit 15, a DC power supply 11 which is insulated from the ground potential unit 15, a capacitor C1 to which voltage from the DC power supply 11 is applied, a control unit 13 which controls charging and discharging of the capacitor C1, a charging circuit that includes the DC power supply 11, the capacitor C1 and a charging path through which the capacitor C1 is charged, and a discharging circuit that includes the capacitor C1 and a discharging path through which the capacitor C1 is discharged. The control unit 13 includes a calculation unit 135 which calculates a voltage value of the DC power supply 11, based on an actual capacitance value C of the capacitor C1 which is obtained by both-end voltage of the capacitor C1 corresponding to a first time and both-end voltage of the capacitor C1 corresponding to a second time.

By using the aforementioned configuration, the voltage detecting circuit 1 is independent of the device characteristics of the capacitor C1 which functions as a flying capacitor, and can increase the detection accuracy of the application voltage $V_0$.

In addition, the voltage detecting circuit 1 according to the present embodiment may include a first resistor R1, a second resistor R2, a first switch S1, a second switch S2, a third switch S3, and a fourth switch S4. The first resistor R1 may be provided between a positive polarity side of the DC power supply 11 and the capacitor C1 and is connected in series to the capacitor C1. The second resistor R2 may be provided in parallel with the first resistor R1 and is connected in series to the capacitor C1. The first switch S1 may be provided between the positive polarity side of the DC power supply 11 and the first resistor R1. The second switch S2 may be provided between a negative polarity side of the DC power supply 11 and the negative polarity side of the capacitor C1. The third switch S3 may be provided between the first resistor R1 and the second resistor R2, and the ground potential unit 15. The fourth switch S4 may be provided between the negative polarity side of the capacitor C1 and the ground potential unit 15. The control unit 13 may further include a switch control unit 134 which controls turning on each of the first switch S1, the second switch S2, the third switch S3, and the fourth switch S4. When the switch control unit 134 controls the first switch S1 and the second switch S2 to be turned on and controls the third switch S3 and the fourth switch S4 to be turned off, the charging path may be conducted, and when the switch control unit 134 controls the third switch S3 and the fourth switch S4 to be turned on and controls the first switch S1 and the second switch S2 to be turned off, the discharging path may be conducted.

By using the aforementioned configuration, detection of the ground resistor and measurement of the voltage value of the DC power supply 11 can be performed by one device. Particularly, the ground detection requires accuracy and fast speed, and thus, a method of increasing detection accuracy while maintaining fast measurement without full charging is effective.

In addition, in the voltage detecting circuit 1 according to the present embodiment, the control unit 13 may further include the measurement unit 132 which measures the both-end voltage of the capacitor C1. When the capacitor C1 is charged through the charging path, the measurement unit 132 may measure charging voltage $V_1$ of the capacitor C1 at the time of switching from the charging path to the discharging path. The measurement unit 132 may measure discharging voltage $V_2$ of the capacitor C1, after switching from the charging path to the discharging path and then a predetermined time passing. The calculation unit 135 may include a capacitance calculation unit 141 and a voltage calculation unit 142. The capacitance calculation unit 141 may obtain the actual capacitance value C of the capacitor C1, based on the charging voltage $V_1$ and the discharging voltage $V_2$. The voltage calculation unit 142 may calculate the voltage value of the DC power supply 11, based on the actual capacitance value C of the capacitor C1 which is obtained by the capacitance calculation unit 141.

Figure 15:
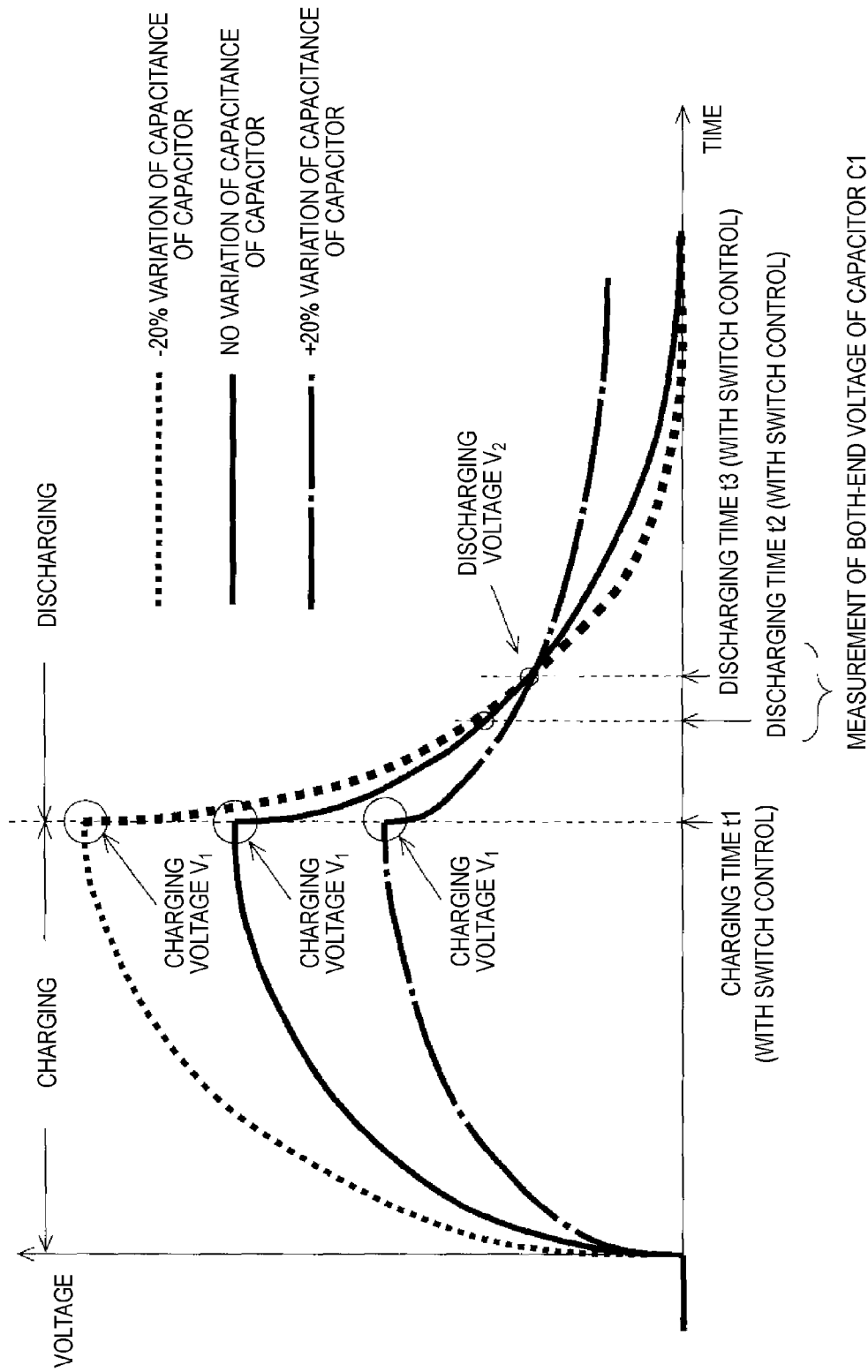
FIG. 15 is a diagram illustrating an example in which switch control is performed at points of time of charging time t1, discharging time t2, and discharging time t3.

Timing in which the first switch S1, the second switch S2, the third switch S3, and the fourth switch S4 are controlled can be simplified by the aforementioned configuration. For example, FIG. 15 is a diagram illustrating an example in which switch control is performed at points of time of the charging time t1, the discharging time t2, and discharging time t3. In addition, for example, FIG. 16 is a diagram illustrating an example in which the switch control is performed at the points of time of the charging time t1 and the discharging time t2.

In a case where of FIG. 15, the charging circuit is switched to the discharging circuit at the charging time t1, the both-end voltage of the capacitor C1 is measured at the discharging times t2 and t3, and thus, the switch control is needed at three points of time. Meanwhile, in a case where of FIG. 16, the charging circuit is switched to discharging circuit and the both-end voltage of the capacitor C1 is measured at the charging time t1, the both-end voltage of the capacitor C1 is measured at the discharging time t2, and thus, the switch control is needed at two points of time. Accordingly, if the number of the switch controls is reduced, the timing of the switch control is simplified.

As described above, the present invention is described based on the embodiment, but the present invention is not limited to the embodiment, and modification thereof may be made in a range without departing from the gist of the present invention.

For example, the present embodiment describes an example in which the control unit 13 acquires the charging time and the discharging time, but is not limited to the example. The control unit 13 may include a time counting unit which is not illustrated, and the time counting unit which is not illustrated may count the charging time and the discharging time.

DESCRIPTION OF REFERENCE NUMERALS AND SIGNS

1: voltage detection circuit 11: DC power supply 13: control unit 15: ground potential unit 41,49: pair of electric path terminals 42,43: photo transistor 44,45: diode 46: light emitting diode 47,48: pair of drive terminals 131: A/D conversion unit 132: measurement unit 133: determination unit 134: switch control unit 135: calculation unit 136: D/A conversion unit 141: capacitance calculation unit 142: voltage calculation unit 151: charging rate calculation unit 152: application voltage calculation unit

What is claimed is:

1. A voltage detecting circuit comprising:
   a ground potential unit;
   a DC power supply which is insulated from the ground potential unit;
   a capacitor to which voltage from the DC power supply is applied;
   a control unit which controls charging and discharging of the capacitor;
   a charging circuit that includes the DC power supply, the capacitor, and a charging path through which the capacitor is charged; and
   a discharging circuit that includes the capacitor and a discharging path through which the capacitor is discharged,
   wherein the control unit includes a calculation unit which obtains an actual capacitance value of the capacitor from both-end voltage of the capacitor measured at a first time and both-end voltage of the capacitor measured at a second time, and calculates a voltage value of the DC power supply, based on the actual capacitance value of the capacitor.

2. The voltage detecting circuit according to claim 1, wherein the voltage detecting circuit further comprises:
   a first resistor;
   a second resistor;
   a first switch;
   a second switch;
   a third switch; and
   a fourth switch,
      wherein the first resistor is provided between a positive polarity side of the DC power supply and the capacitor, and is connected in series to the capacitor,
      wherein the second resistor is provided in parallel with the first resistor, and is connected in series to the capacitor,
      wherein the first switch is provided between the positive polarity side of the DC power supply and the first resistor,
      wherein the second switch is provided between a negative polarity side of the DC power supply and the negative polarity side of the capacitor, wherein the third switch is provided between the first resistor and the second resistor, and the ground potential unit, wherein the fourth switch is provided between the negative polarity side of the capacitor and the ground potential unit, wherein the control unit further includes a switch control unit which controls turning on each of the first switch, the second switch, the third switch, and the fourth switch, wherein when the switch control unit controls the first switch and the second switch to be turned on and controls the third switch and the forth switch to be turned off, the charging path is conducted, and when the switch control unit controls the third switch and the fourth switch to be turned on and controls the first switch and the second switch to be turned off, the discharging path is conducted.

3. The voltage detecting circuit according to claim 2, wherein the control unit further includes a measurement unit which measures the both-end voltage of the capacitor, wherein when the capacitor is charged through the charging path, the measurement unit measures charging voltage of the capacitor at the time of switching from the charging path to the discharging path, wherein the measurement unit measures discharging voltage of the capacitor, after switching from the charging path to the discharging path and then a predetermined time passing, wherein the calculation unit includes a capacitance calculation unit and a voltage calculation unit, wherein the capacitance calculation unit obtains the actual capacitance value of the capacitor, based on the charging voltage and the discharging voltage, wherein the voltage calculation unit calculates the voltage value of the DC power supply, based on the actual capacitance value of the capacitor which is obtained by the capacitance calculation unit.

4. A voltage detecting method comprising:

forming a ground potential unit;

forming a DC power supply which is insulated from the ground potential unit;

forming a capacitor to which voltage from the DC power supply is applied;

forming a control unit which controls charging and discharging of the capacitor;

forming a charging circuit that includes the DC power supply, the capacitor and a charging path through which the capacitor is charged;

forming a discharging circuit that includes the capacitor and a discharging path through which the capacitor is discharged;

obtaining an actual capacitance value of the capacitor from both-end voltage of the capacitor measured at a first time and both-end voltage of the capacitor measured at a second time; and calculating a voltage value of the DC power supply, based on the actual capacitance value of the capacitor.

* * * * *